United States Patent [19]

Barnert

[11] 3,937,255

[45] Feb. 10, 1976

[54] SAFETY EQUIPMENT FOR INSTALLATIONS UNDER PRESSURE

[75] Inventor: Heiko Barnert, Julich, Germany

[73] Assignee: Kernforschungsanlage Julich Gesellschaft, Julich, Germany

[22] Filed: Oct. 4, 1973

[21] Appl. No.: 403,417

[30] Foreign Application Priority Data

Oct. 11, 1972 Germany............................ 2249690

[52] U.S. Cl. .................. 138/148; 138/44; 138/113; 176/38; 176/87; 220/9 R
[51] Int. Cl............................ F16l 9/18; F16l 57/00
[58] Field of Search ............ 138/44, 108, 113, 114, 138/148, 177; 176/31, 79, 80, 38, 87

[56] References Cited
UNITED STATES PATENTS

| | | | |
|---|---|---|---|
| 1,660,714 | 2/1928 | Lincoln............................... | 138/148 |
| 2,401,974 | 6/1946 | Silbels............................... | 138/114 X |
| 3,495,630 | 2/1970 | Hansen et al................... | 138/113 X |
| 3,633,946 | 1/1972 | Kazmeiski, Jr.................... | 138/44 X |
| 3,774,645 | 11/1973 | Pompa................................. | 138/44 |

FOREIGN PATENTS OR APPLICATIONS 886,316   1/1962   United Kingdom................ 138/114

Primary Examiner—John W. Huckert
Assistant Examiner—Charles Gorenstein
Attorney, Agent, or Firm—Edwin E. Greigg

[57] ABSTRACT

What follows is a description of a unique arrangement forming safety equipment for installations containing a medium under pressure. The safety equipment includes a wall of the installation whose thickness is reduced in a predetermined region relative to the remaining region of the wall and an element disposed within the installation which extends over and beyond the reduced thickness region of the installation wall. The element is provided with bulges at its ends which define along with the inner surface of the installation wall a reduced flow cross section. This reduced flow cross section is chosen so that the pressure prevailing during normal operation in the space defined by the inner surface of the installation wall and that portion of the element between the bulges is the same as the pressure prevailing in the installation.

2 Claims, 5 Drawing Figures

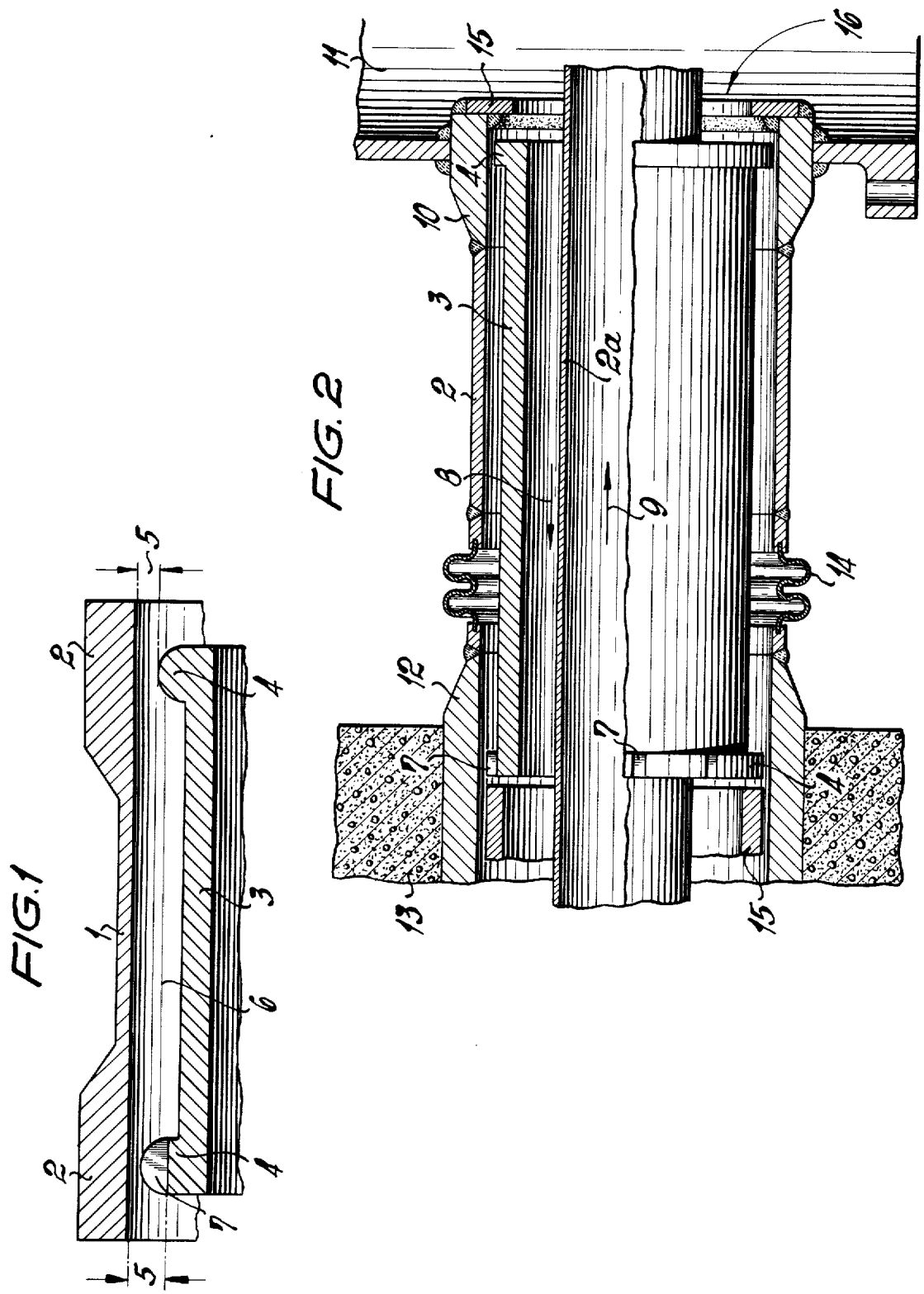

SAFETY EQUIPMENT FOR INSTALLATIONS UNDER PRESSURE

BACKGROUND OF THE INVENTION

The present invention relates to safety equipment for installations containing a medium under pressure.

Safety equipment for installations containing a medium under pressure is widely used in technology. It is used, for example, in high pressure technology, in container technology, in chemical technology and also in nuclear reactor technology. In nuclear reactor technology, such equipment is used especially for gas-cooled reactors, high temperature reactors, liquid cooled reactors and also for reactor pressure lines and reactor pressure vessels.

This safety equipment is intended to reduce and to limit to a predetermined area any immediate effects of damage which can occur due to the bursting of pressure installations bulkheads.

Safety equipment of the above-described type, intended to guarantee that the fluid stream occasioned by the escape of the pressurized medium from the installation is limited to a minimum, has been proposed in different embodiments. Thus, for example, safety equipment used in the live steam lines of boiling water reactors and designated as "flow limiter" is known. This device is developed as a nozzle, especially as a veturi, and is to be disposed in a steam boss of the reactor pressure vessel. In this way the rate of pressure reduction in the neclear reactor due to line ruptures outside of the reactor is reduced. In order to further reduce the rate of the pressure reduction in the reactor, it has been additionally proposed to provide rapidly closing reflex flaps in the lines. The disposition of such flow limiters have proven successful in prolonging the duration of the pressure drop, during a case of damage, so that a pressure drop of from 70 atmospheres to 15 atmospheres required approximately 150 seconds. As a result, damage to the fuel elements was avoided. However, when such flow limiters are used with boiling water reactors, the resulting cross sectional reduction also limits the flow of the cooling medium from the reactor pressure vessel. The consequence of this is that it is impossible to increase the effect of a flow limiter by reducing the flow cross section to be limited. The flow cross section must be at least large enough so that under the condition of the highest possible velocity, i.e. the velocity of sound, the mass flow rate of the normal cooling medium can still pass through the limited flow cross section. Furthermore, when flow limiters are used, the necessary deceleration of the pressurized medium which is accelerated up to the limiting flow cross section, brings with it unavoidable losses. A reduction of the limiting flow cross section, which is desirable in order to increase the effectiveness of the safety equipment, is therefore not possible at all or not in the desired measure. If this safety equipment is used during a disturbance, then the stream passing through the flow limiter can be reduced to the value of the normal stream passing through the pressure line only if considerable energy losses are accepted. It is not possible to reduce the value of this steam below the normal value.

In other know safety equipment, which is used especially in pipe lines, it is provided that in a particular predetermined section of the pipe line two coaxially disposed pipes are provided whose walls are dimensioned for the full pressure difference. The space between the inner and outer pipe is filled with a medium that is under such pressure that the inner pipe is pressure relieved in normal operation, whereas the outer pipe carries the full pressure. In this way, losses are eliminated when rupture of the outer pipe occurs because the full pressure is taken over the inner pipe. The design is such that the pressure is maintained for a predetermined period of time. What is disadvantageous in the use of this safety equipment is that it is necessary to provide connections between the inner and outer pipes. Because of this, tensile stresses are created between the two pipes. These stresses are generated during manufacture of they occur because of the forces developed during installation. They can also be caused through changes which occur in the outer mounting conditions, for example, by long term creep or construction settling, or they can be caused by temperature fluctuations. Added to this is the fact that forces, for example, pressure forces, exerted on one line, can produce forces in the other line. If the pressure control fails, the pressure pad which loads the inner line can produce stresses between the two lines.

If this known safety equipment is used in hot gas lines, then further limitations accrue from the generated internal stresses. Furthermore, even in the most general case, when the inner pipe is designed with due consideration for all the possible loads that can occur in an emergency, further difficulties accrue because of the devices and compensators that must be provided. Required checks or tests of the inner line are furthermore possible only with considerable effort, if at all.

OBJECTS AND SUMMARY OF THE INVENTION

It is a general object of the present invention to provide safety equipment without the above noted difficulties.

It is another and more specific object of the present invention to provide safety equipment by means of which the size of the damaged area in a pressure-bearing wall of a pressurized installation is held within narrow limits by means of which the damaged area occurring as a result of a failure is maintained within a predetermined region and by means of which the flow cross section of the fluid stream flowing out through the damaged area is limited to a value that can be as small as desired.

It is still another object of the present invention to provide safety equipment which additionally protects other installations disposed within the pressure region from supplementary loads which might occur during failure.

These and other objects are achieved according to the present invention by the provision of equipment of the above designated type in that the wall thickness of the installation is reduced in a predetermined region with respect to the remaining region thereof, and that within the installation there is provided an element which extends over and beyond the reduced thickness region of the installation wall and which has bulges at its edges that reduce the flow cross section through which the pressurized medium flows in the event of damage to the installation wall at the reduced thickness region thereof. The cross section formed by the bulges and the inner surface of the installation wall is chosen so that the pressure prevailing during normal operation in the space defined by the inner surface of the installation wall and that portion of the element between the bulges is the same as the pressure prevailing in the installation.

An advantage of the present invention results in that the wall of the installation and the wall covering the potential damage location are not normally in contact so that no forces can be transmitted from one wall to the other.

It is a further advantage of the present invention in that the wall extending over the damage location does not experience any external loading unless actual damage occurs.

In an installation according to the present invention, the flow cross section formed between the bulges and the inner surface of the installation wall characterizes the magnitude of the losses occurring during an escape of the pressurized medium. The losses occurring in case of damage can therefore be held to a minimum. Since the size of the intermediate location formed by the bulges and the inner surface of the installation wall can also be largely limited by taking into consideration the dimensioning of the installation and the safety element, the volume of the pressurized medium in the intermediate location is also limited. In this way the damage itself in the damage area is limited.

It can be suitable according to the present invention to provide grooves in the bulges which serve to increase the flow cross section for the pressurized medium.

The sizing of the safety installation according to the present invention proceeds in such a way that deformations which can occur due to loading shall have no influence on internal structure parts. This can be accomplished in such a way that damage-secure regions are provided between two or more safety elements lying close to each other at a small distance. The end bulges and the volume defined by these bulges and by the inner surface of the installation wall, as well as the volume defined by the inner surface of the installation wall and that portion of the element between the bulges, are dimensioned in such a way that during any foreseeable position changes of the damage-secure regions of the pressure wall of the installation, no mutual stresses can occur between the wall extending over the potential damage region and the pressure wall, even in case of damage. The rigidity of the wall extending over the potential damage region can be chosen in a simple manner by considering the material to be used and by a corresponding dimensioning, in view of the loading, in case of damage, which is given by the pressure prevailing in the installation and in the pressure reduction in the space formed by the inner surface of the installation and the internal element. If the foreseeable loading of the internal element becomes so large that deformations would be unavoidable, then several elements according to the present invention are disposed one behind the other or next to each other.

It has been shown that the speed of the pressure reduction, when the safety equipment according to the present invention is used, is up to 1000 times slower under identical conditions than when previously used flow-limiters are employed.

A further significant advantage in the use of the safety equipment according to the present invention consists in that the damage location in the potential damage region was smaller by several powers of ten than in those cases where the safety equipment according to the present invention was not used.

Further advantages consist in that the safety equipment according to the present invention can be very simply tested by optical instruments, by X-rays, or by ultrasonic means. Its simple construction is advantageous because the evidence of stresses and of deformations in case of damage is easily surveyable.

BRIEF DESCRIPTION OF THE DRAWING

In the drawing there are shown five exemplary embodiments of the invention which are described further below.

FIG. 1 is a schematic layout illustrating the safety equipment of the present invention partially in cross section.

FIG. 2 is a partial cross sectional view illustrating an exemplary disposition of the safety equipment in a coaxial pipe line.

DESCRIPTION OF THE PREFERRED EMBODIMENTS

Figure 3:
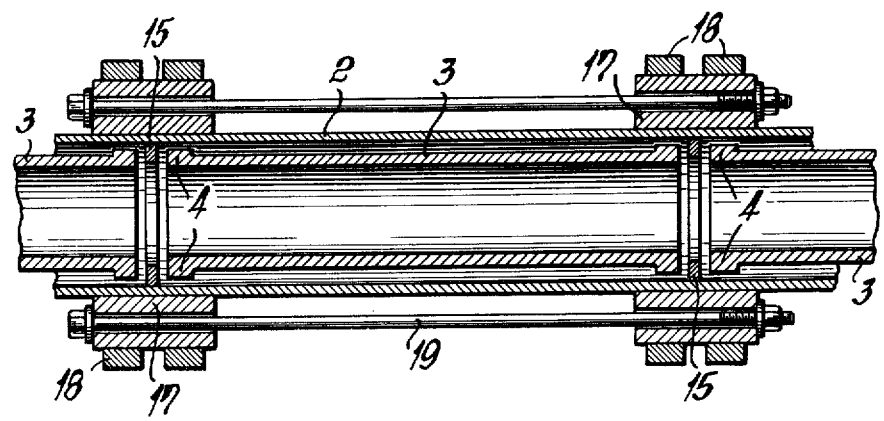
FIG. 3 is a partial cross sectional view illustrating a sequential disposition of several units of safety equipment in one pressure line.

As can be seen from the various figures, the safety equipment according to the present invention is formed by reducing the cross section of the pressure wall 2 of a pressurized installation thereby resulting in a region 1. The reduced cross sectional region 1 is provided so that in case of damage, the damage location lies in region 1. Thus wall 2 aside from region 1 as made burstproof. Within the installation there is disposed an element such as a wall 3 or plate or the like which extends over and beyond the region 1. The two ends or rims of the wall 3 are equipped with bulges 4. The wall 3 does not made contact with the pressure bearing wall 2, and as a result, the wall 2 and bulges 4 define a flow cross section 5, while the portion of the wall 3 between the bulges 4 and the wall 2 define a space 6. During normal operation, the spacing between the bulges 4 and the wall 2 is calculated so that the flow cross section 5 which determines the magnitude of the flow of the medium contained in and escaping from the installation in case of damage is made as small as possible. Also during normal operation, the space 6 contains the same pressure as prevails within the installation. In order to guarantee as good a match as possible of the flow cross sections to the prevailing conditions, for example, in order to insure the effectiveness of the flow cross sections even in the case of thermal expansion then it is suitable to provide grooves 7 in the bulges 4 of the wall 3.

The exemplary embodiment shown in FIG. 2 shows the installation of safety equipment according to the present invention in a coaxial pipe line, for example, one intended for a cold gas stream 8 and a hot gas stream 9. The coaxial pipe line is formed by the pressure pipe 2 and the separation pipe 2a. This coaxial line is shown to have a stud 10 connected to a pressure container 11 and an armored section 12 connected with a pre-stressed concrete container 13. If, as shown, the pipe line is relatively short, then the wall of the pressure pipe 2 can have, over its entire length, a cross section which is so small that in case of damage the wall of the pipe line 2 bursts. As is commonly done, the pipe line 2 is provided with a compensator 14. The wall 3 which covers the pootential damage region is in this case tubular so that the bulges 4 lie opposite the stud 10 and the armored pipe 12. The tubularly developed wall 3 lies free and unattached within the pressure pipe 2 and is held in its axial direction with little play by positioning elements 15. Inspection and tests are easily possible, as shown in FIG. 2, through access 16.

As can be seen in FIG. 3, for long pipe lines, the pressure line 2 can suitably be interrupted with burstproof intermediate locations 17 which are stressed by a plurality of tensioning elements 18 for th purpose of increasing the bursting security. In order to deal with axial stresses, tensioning means 19 are provided between the burstproof intermediate location 17 which act in the axial direction. The tubular walls 3 which extend over the potential damage locations are dimensioned so that the rim bulges 4 lie in each case in the region of the burstproof intermediate regions 17.

Figure 4:
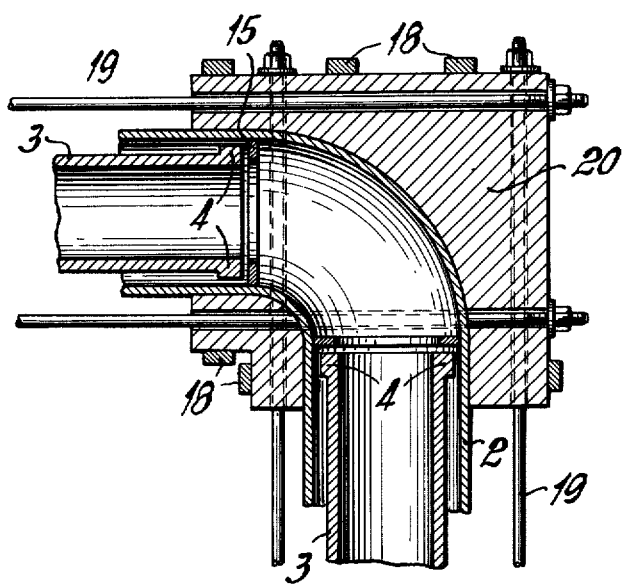
FIG. 4 is a partial cross sectional view illustrating the disposition of the safety equipment in an elbow pipe.

If an elbow 20 is provided, as shown in FIG. 4, then the elbow 20 is developed suitably so that it is burstproof, whereas the walls of the straight line sections of the pipe line have a wall thickness which is either partially or completely so dimensioned such that in case of damage, the damage location will occur in them rather than in the elbow. The walls 3 which extend over the potential damage locations are therefore disposed in that region of the pipe line.

Figure 5:
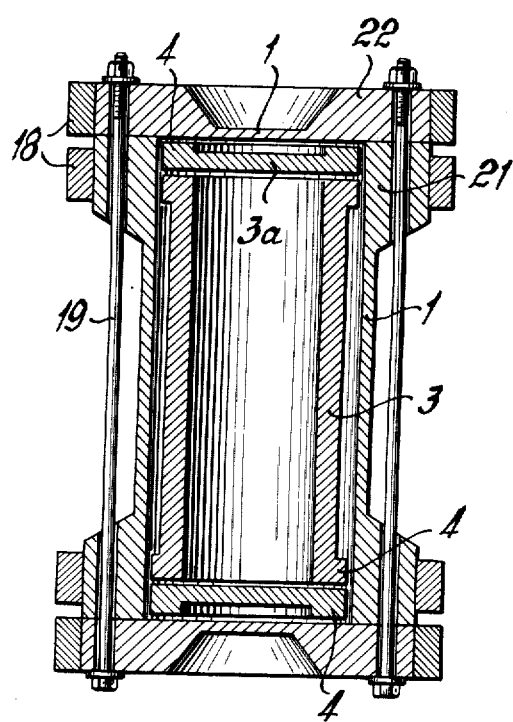
FIG. 5 is a partial cross sectional view illustrating the disposition of several units of safety equipment in a pressure vessel.

In FIG. 5 there is shown in exemplary embodiment in which cylindrical collars 21 are provided between the region 1 of reduced cross section. The region 1 has a tubularly developed wall 3 extending over its length such that the rim bulges 4 lie in the region of the cylindrical collars 21. The lid and bottom of the installation also have regions 1 with reduced cross section lying between annular collars 22. In this case the walls 3a which extend over the potential damage locations are developed as plates so that the bulges 4, disposed at their rims, lie in the region of the annular collar 22. The burstpoof regions, as also shown in FIG. 5, are stressed for increased security by means of tensioning elements 18 and by means of axial tensioning means 19.

The advantageous effects of the measures according to the present invention become apparent when observing the damage which can occur in a piping system similar to that of the exemplary embodiments of FIGS. 1 and 2. In a test installation the pressure wall 2 was made of mild steel 17 Mn4 (1.0844) with an outer diameter of 1044 mm and a wall thickness of 20 mm. The diameter of the wall 3 which was made of the same mild steel was 990 mm with a wall thickness of 30 mm. The bulges 4 had a height and a radius of about 4 mm. The length of the reduced region 1 in the circumferential direction of the wall 2 was about 50 mm.

The piping system was enveloped with helium at a pressure of 40 bar. Thus a pressure of this magnitude was present in the regions 8, 7, 6 and 5 of the pressurized installation before the damage occurred. The helium as well as the walls 2 and 3 were at a temperature of 250°C.

The damage consisted in bursting of the wall 2. At the beginning of the subsequent pressure equalization process, which lasted several minutes, the pressure in the regions 5 and 7 measured at 20 bar, in the space 6 at 1 to 2 bar, and at the damage site itself the pressure was 1 bar. The damage area in the pipe having the wall 2 after the damage occurred was not larger than about 200 cm$^2$.

What is claimed is:

1. Safety equipment for installations containing a medium under pressure, including a wall of the installation the thickness of which is reduced in a predetermined region relative to the remaining region of the wall, and an element disposed within the installation which extends over and beyond said reduced thickness region, said element having bulges formed at its ends which define along with the inner surface of the installation wall a reduced flow cross section through which the pressurized medium flows in the event of damage to the installation wall at the reduced thickness region thereof, said reduced flow cross section being chosen so that the pressure prevailing during normal operation in the space defined by the inner surface of the installation wall and that portion of said element between said bulges is the same as the pressure prevailing in the installation.

2. The safety equipment as defined in claim 1, wherein said bulges are provided with grooves thereby serving to increase the flow cross section for the pressurized medium.

* * * * *